United States Patent [19]

Ostrander et al.

[11] Patent Number: 4,783,034
[45] Date of Patent: Nov. 8, 1988

[54] SLIDE LOCK MECHANISM

[75] Inventors: Walter M. Ostrander, Bridgewater; Andrew Hornak, New Milford, both of Conn.; Gregory Sorrentino, Brewster, N.Y.

[73] Assignee: General Datacomm, Inc., Middlebury, Conn.

[21] Appl. No.: 13,507

[22] Filed: Feb. 11, 1987

Related U.S. Application Data

[63] Continuation-in-part of Ser. No. 765,281, Aug. 13, 1985, abandoned.

[51] Int. Cl.$^4$ ................................................ F16B 1/00
[52] U.S. Cl. .............................. 248/223.1; 248/223.2; 403/316; 403/317
[58] Field of Search .................... 248/73, 220.2, 220.3, 248/220.4, 221.1, 221.3, 222.1, 222.4, 223.1, 223.2; 24/697, 701, 573; 403/254, 255, 316, 317

[56] References Cited

U.S. PATENT DOCUMENTS

| | | |
|---|---|---|
| 891,188 | 6/1908 | Schenk . |
| 2,088,320 | 7/1937 | DeVries . |
| 2,422,693 | 6/1947 | McArthur ............................ 24/701 |
| 2,443,783 | 6/1948 | Bogin . |
| 2,548,993 | 4/1951 | Mierzwa . |
| 2,717,717 | 9/1955 | Busch ............................ 248/222.4 |
| 2,980,381 | 4/1961 | Dectrow . |
| 3,043,130 | 7/1962 | Patterson . |
| 3,125,316 | 3/1964 | Wilmhoff . |
| 3,159,368 | 12/1964 | Ahlbin ............................ 248/222.4 |
| 3,180,606 | 4/1965 | Sabin . |
| 3,299,839 | 1/1967 | Nordbak . |
| 3,880,396 | 4/1975 | Freiberger . |
| 4,121,495 | 10/1978 | Malo . |
| 4,410,155 | 10/1983 | Wetterhorn . |
| 4,458,872 | 7/1984 | Couch . |
| 4,470,716 | 9/1984 | Welch . |

Primary Examiner—Alvin C. Chin-Shue
Assistant Examiner—Robert A. Olson
Attorney, Agent, or Firm—Howard I. Podell; David P. Gordon

[57] ABSTRACT

The invention is a shaped base plate assembly onto which one or more separate units may be detachably mounted. One common latch plate, bolted to the base plate, fixes all the separate units in place in fixed relation to each other and to the base plate. The invention may be employed to mount four separate transformers to a common base plate. Each transformer is fitted with appendages such as four cylindrical legs, each leg being shaped with a circular undercut of reduced cross-section adjacent the free end of the leg. The base plate is formed with sets of keyhole-shape or teardrop-shape holes, with each set of holes located to accommodate the legs of a given transformer. When all four transformers have been inserted and then slid into the latched position, a latch plate is fastened by one latch screw to the base plate. The latch plate is of a shape and size to abut against at least one leg of each transformer and to bias the undercut section of each transformer leg snugly against an edge of a base plate hole. By preventing each transformer from being slid towards the latch plate, the undercut section of each transformer leg is latched in place against the edge of a base plate holes, and all four transformer units are held in place on the plate. The latch plate may be slidably mounted to the base plate and shaped so that it does not abut against the transformer legs when slid to an unlatched position and conversely abuts firmly against at least one leg each of a pair of mounted transformers when slid into a latched position.

17 Claims, 4 Drawing Sheets

SLIDE LOCK MECHANISM

This application is a continuation-in-part of our previous application Ser. No. 06/765,281 filed Aug. 13, 1985 which is herewith abandoned.

FIELD OF THE INVENTION

This invention relates generally to an improved slide lock mounting plate assembly for secure attachment of components to a base plate, which also provides for ready detachment of these components, as desired.

STATEMENT OF THE PRIOR PATENTS

The art is exemplified by the disclosures of the following U.S. Pat. Nos.: 4,121,495; 3,880,396; 2,088,320; 4,410,155; 3,180,606; 2,443,783; 891,188; 4,470,716; and Russian Pat. No. 531,933.

More specifically, U.S. Pat. No. 3,880,396 teaches a fastening system that has key slots in a flexible plate the flexes when installed so as to act as a latch to spaced fasteners. U.S. Pat. No. 2,088,320 shows a a screw fastener fitted with an internal spring-biased detent that projects from the screw head. U.S. Pat. No. 891,188 shows a rotating key type of fastener in a keyhole-shaped slot. U.S. Pat. No. 4,470,716 shows a clip for use in a joint structure.

Russian Patent No. 531,933 shows a coil spring fixed to a mounting plate which acts to apply lateral bias to a pin mounted in an adjacent keyhole-shaped slot to mantain the pin in the latched location of the slot.

U.S. Pat. No. 4,121,495 deals with the use of keyhole-shaped slots to retain bolts to which a rigid freight car ladder rung may be anchored. Item 35 of FIGS. 1, 2, and 3 is a soft sealing strip of caulking tape with no latching function.

While these patents describe various forms of keyhole slots and mating fasteners, there is no suggestion of the simplicity and ease of use of the subject invention.

The principal object of this invention is to provide an article of this character which combines simplicity, strength and durability in a high degree, together with inexpensiveness of construction. Other objects of the invention will in part be obvious and in part hereinafter pointed out.

SUMMARY OF THE INVENTION

The invention is a base plate onto which pairs of separate units may be detachably mounted. One common latch plate, bolted to the base plate, securely fixes all the separate units in place in fixed relation to each other and the base plate. The application may be employed as a mounting for four separate transformers. Each transformer is fitted with four shaped cylindrical legs, with at least one leg of each transformer formed with an annular circular undercut slot near its free end with the slot bounding a reduced cross-section of the transformer leg.

The base plate is formed with four sets of four shaped mounting holes each, with each of the holes of each set of mounting holes located to accommodate one of the four legs of a given transformer. The shaped holes are formed along parallel lateral axes in the base plate. The holes may be of a keyhole-shape or preferably of a tear drop shape being each formed with an enlarged-size hole section that is joined along a said lateral axis to a reduced-size hole section. The enlarged-size hole opening section of each mounting hole is of a size to freely accomodate the maximum size section of a transformer leg. The reduced-size section of each mounting hole is of a smaller size than that of the said maximum size section of a transformer leg, but is of a size to freely accomodate the reduced size section of a transformer leg that is bounded by the annular slot. The reduced-size hole section of each of the shaped mounting holes extend laterally away from a common longitudinal axis on the plate, with pairs of two sets of holes each located on opposed sides of the common longitudinal axis. When the each of the four legs of a transformer have been individually inserted into the enlarged section of a respective mounting hole, the reduced sectional portion of each transformer leg is aligned to lie within the bounds of the respective mounting hole in plane of the base plate, and the transformer and legs manually laterally slid parallel to the plane of the base plate away from the longitudinal common axis of the base plate and into the latched position, in which the slot walls of the reduced-size section of each mounting hole fit about a portion of the annular slot section of an engaged transformer leg to prevent any motion of the transformer and legs along an axis perpendicular to the plane of the base plate and along an axis parallel to the common longitudinal axis.

A teardrop shape is preferred for the outline of the mounting holes in the base plate because such a shape allows for increased tolerances in the spacing of the transformer legs from each other. The legs of transformers are spaced apart from each other by the internal spacing of holes of the plurality of iron lamination plates which make up the structural frame of the transformer. The consequence of this type of assembly of the transformer laminations results in somewhat irregular spacing from each other of the mounted transformer legs, thus requiring a substantial tolerance in the spacing and size of conventional mounting holes in the base plate which receive the transformer legs.

We find that the teardrop shape mounting holes of our invention provide the necessary ease of installation within these parameters of tolerance of location of the mounting legs of commercial transformers.

A latch plate may be slidably mounted to the base plate and shaped so that it does not abut against the transformer legs when slid to an unlatched position and conversely abuts firmly against at least one leg each of a pair of mounted transformers when slid to a latched position. The latch plate may be fastened by a screw or other means through an elongated slot in the latch plate to the base plate. The latch plate is located over a common mid-axis between a pair of mounted transformers. The installed latch plate prevents the transformers from sliding in the plane of the base plate towards the said common mid-axis and out of the latched position in the mounting holes. The latch plate is of a shape and size to abut against at least one leg of each pair of installed transformers, preventing any latched transformer from sliding away from the latched position of the transformer towards the mid-axis of the base plate and consequently prevents any transformer leg from sliding into the enlarged section of the tearshaped mounting hole, while the latch plate remains installed.

The latch plate may be formed of a resilient material and shaped with projections that each flex to bear against a latched leg, so as to apply a bias to retain the leg snugly in the latched position.

Preferably, the latch plate may be shaped with tapered shaped side walls that furnish a wedging action against the abutting transformer legs when the latch plate is manually slid along the mid-axis and forced into the latched position. The base plate may contain a through slot located to furnish an anchoring position for a screw driver blade that may be inserted into a said slot and rotated against a first end wall of latch plate to cause the latch plate to move parallel to the mid-axis and so wedge its tapered walls snugly against abutting transformer legs mounted in the base plate holes, in the fully latched position of the latch plate. A second similar through slot may be mounted in the base plate at a spaced distance from the first through slot and located to furnish an anchoring position for a screw driver blade that may be rotated within said slot against a second latch plate end wall, opposed to said first end wall, slot to force the latch plate to slide from the latched position to an unlatched position.

DESCRIPTION OF THE BEST MODE OF THE INVENTION

Figure 1:
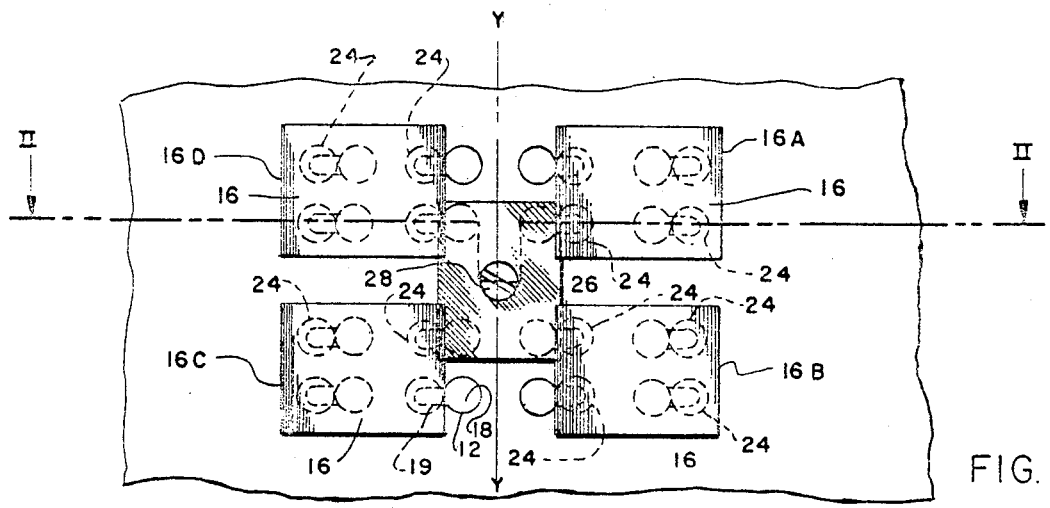
FIG. 1 is a top plan view illustrating a base plate to which four transformers are detachably mounted.

Turning now descriptively to the drawing, in which similar reference characters denote similar elements throughout the view, FIGS. 1-3 and 5 illustrate the base plate 10 of the invention onto which a plurality of separate components such as transformers 16, may be detachably and latched into position by one common latch plate 26 that can be bolted to the base plate 10. Once installed, the latch plate 26 fixed all the separate units 16 in place in fixed relation to each other and to the base plate 10.

Figure 2:
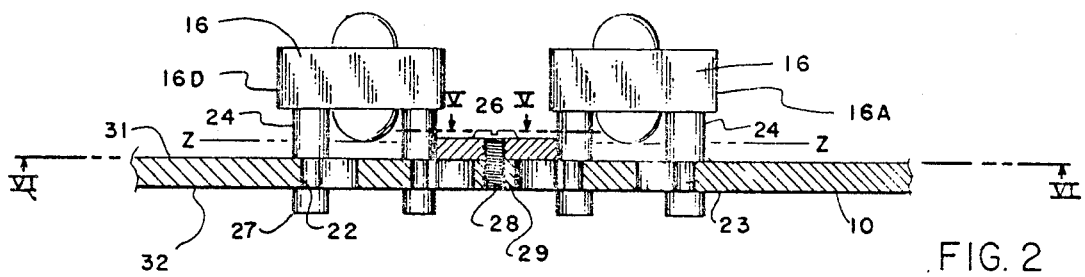
FIG. 2 is a detail sectional front view of the invention in use, taken along line 2—2 of FIG. 1.

The description of the preferred embodiment of the invention is given by way of the example of a mounting assembly of four individual separate transformer units 16, although the invention is applicable for mounting of other types and other quantities of articles. For descriptive purposes, the use of directional words such as "up" and "bottom" will assume that each transformer 16 is mounted to a base plate 10 that is lying in horizontal orientation and that each transformer is to be latched in place above the base plate, as shown in FIG. 2. In actual use of the invention, however, the base plate and the mounted transformers may be oriented along any desired axis, and the transformers may be mounted on both sides of the base plate 10.

Figure 4:
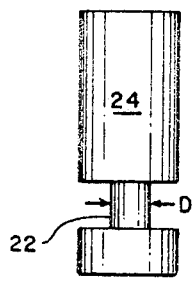
FIG. 4 is a detail side view of a transformer leg.
Figure 5:
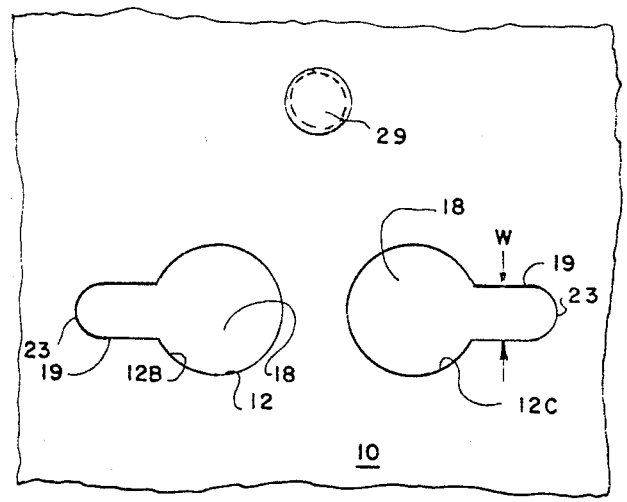
FIG. 5 is a detail plan view of the base plate.

Each transformer 16 is fitted with four spaced cylindrical legs 24 that each project vertically along generally parallel axes beyond the bottom plane Z—Z of the body of the transformer. Each leg 24 of the transformer is formed with an annular undercut section 22 of reduced diameter located near its free end 27, at a spaced distance below said bottom plane Z—Z, as shown in FIGS. 2 and 4. The number of transformers to be mounted to a common base plate may vary. Other units, fitted with similarly shaped and projecting mounting legs 24 may be mounted to base plate 10 instead of, or together with transformers. The number of legs per unit may be as few as one and as many as desired.

The base plate 10 is formed with four sets A, B, C and D of four keyhole-shaped holes 12, identified on FIG. 2 as holes 12A, 12B, 12C and 12D each. These holes of the base plate are located so that each hole 12 of a set A, B, C, or D accommodates one of four legs 24 of a given transformer 16A 16D respectively. Each shaped hole 12 is formed of a large circular opening section 18 of a diameter equal to or slightly larger than the maximum outer diameter of a transformer leg 24, with opening 18 joined to a small slot section 19. The slot section is of a width "W" of the root which is equal to or slightly greater than diameter "D" of the undercut section 22 of a leg 24, with all slot sections 19 of each set of holes 12A-12D oriented to extend along parallel axes away from the mid-axis Y—Y of the plate 10.

The four legs 24 of a transformer 16 are each readily accommodated through a respective individual circular section 18 of a base plate hole 12 with each of legs 24 of the transformer inserted manually through the circular section of a hole 12, when installed. Each transformer is then latched in place to base plate 10 by engaging undercut section 22 of each leg 24 in a respective slot section 19 of a hole 12 as the transformer is manually slid laterally in a direction away from mid-axis Y—Y and away from an adjacent similarly mounted transformer. In the latched position, the undercut section 22 of each transformer leg is latched to prevent movement perpendicular to or from the plane of plate 10, by being engaged in the slot section 19 of a respective base plate hole 12.

Figure 3:
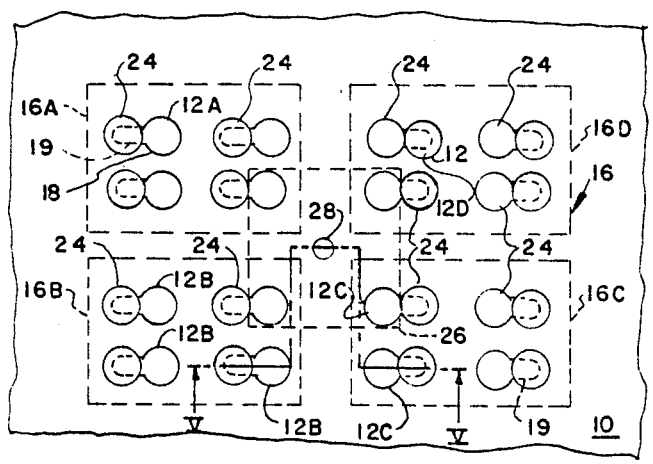
FIG. 3 is a bottom plan view of the base plate and installed transformers.

When all four transformers have been slid into the latched position, as shown in bottom view of FIG. 3, a latch plate 26 is fixed in position against either the bottom surface 32 or the top surface 31 of the base plate. The latch plate is of a shape and size to abut against at least one leg 24 of each transformer 16, preventing any transformer from being slid towards the latch plate and towards the plate mid axis Y—Y, thus preventing any transformer leg from sliding out of latching engagement with slot section 19 of a hole 12. While the latch plate 26 may be of a size to fit snugly against the legs 24 so as to remain in place after being inserted, plate 26 may also be fastened in place by a latch plate screw 28 to the base plate.

Removal of latch plate 26 from base plate 10 is readily accomplished when it is desired to remove a transformer for repair or replacement, by unfastening latch plate screw 26. After plate 26 has been removed, any or all of the transformers may be slid manually towards the mid-axis Y—Y of the base plate to locate each of the legs of a transformer completely within circular section 18 of each engaged hole 12. The transformer may then be readily removed by manual movement away from base plate 10 in a direction perpendicular to the plane of the plate 10.

Figure 6:
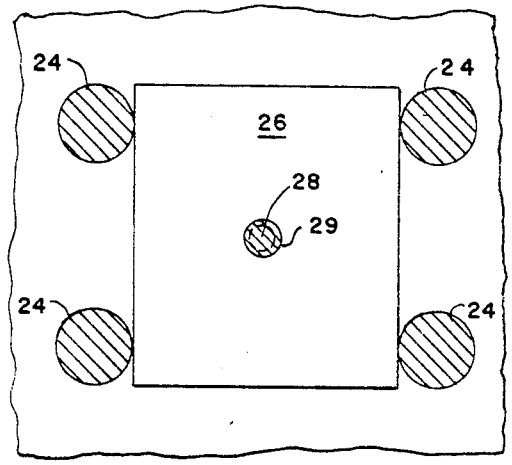
FIG. 6 is a plan view of the latch plate taken along plane 6—6 of FIG. 2.
Figure 7:
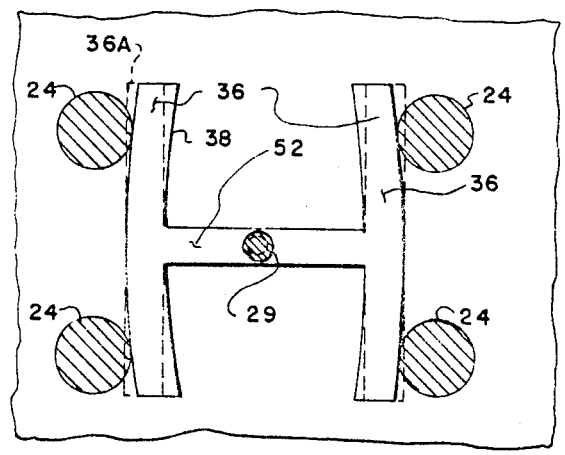
FIG. 7 is a plan view of an alternative embodiment of the latch plate, taken along plane 6—6 of FIG. 2.

Plate 36 is an alternative embodiment of latch plate 26, as shown in FIGS. 4, and 6-7. Plate 36 is formed of a resilient material and of a shape and size so as to apply bias against each abutting transformers legs 24 and force these legs against the end wall 21 of each engaged slot section 19 to prevent vibration or movement of the latched transformer legs.

As shown in FIG. 4, plate 36 may be may be formed with individual resilient finger elements 38 joined to a common central member 52. Each finger element 38 is shaped to bear against and apply pressure against an abutting installed transformer leg 24 in the latched position of the leg 24 in slot section 19 of a keyhole 12. The resilient nature of the material from which the plate 36 is formed, and the size of the finger element 36 permits each finger element to flex sufficiently in the installed position, away from the unflexed position 36A shown in dotted lines in FIG. 7, so as to apply bias against the abutting transformer leg and thus eliminate any vibration of the latched transformer leg with respect to the base plate. Flexed finger elements 36, by applying lateral pressure against the abutting transformer legs, restrict movement of a transformer leg in a slot 19 of a hole 12 and also force the transformer leg into abutting engagement with the lateral wall 23 of slot 19.

Prior structures employed for these purposes required the threading of each of the legs of these transformers and the fastening of a locknut to each of the four threaded legs of each of the transformers in order to mount each of four transformers securely to a base plate, as compared to the present invention in which the fastening of only one screw 28 and one inexpensive latch plate 26 is now required to securely latch four transformers in detachable assembly to a common base plate.

Figure 8:
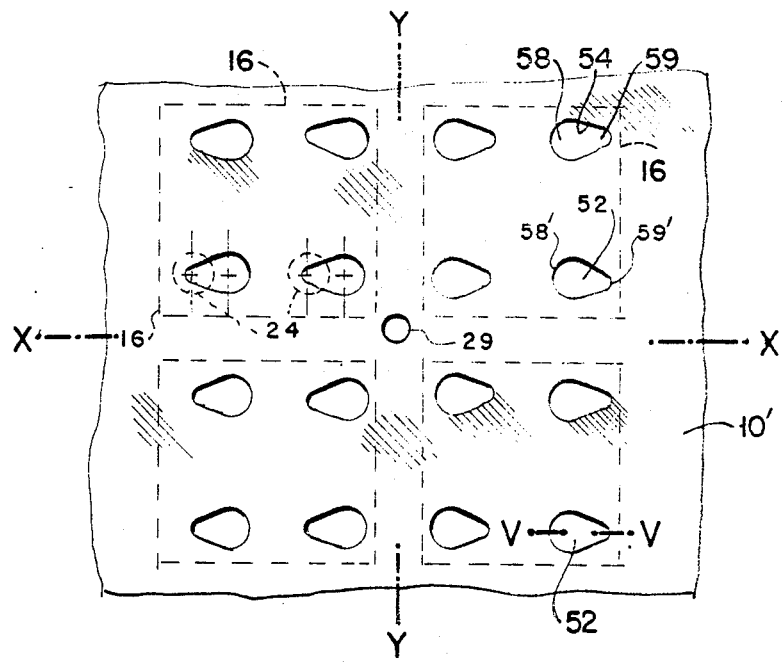
FIG. 8 is a bottom plan view of a second alternative embodiment of the invention, depicting an installed transformer, latched in position through teardrop shape mounting holes of the base plate.
Figure 9:
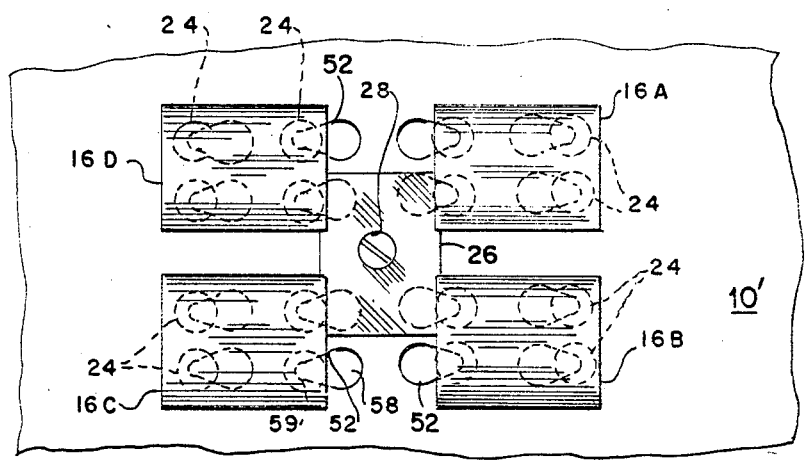
FIG. 9 is a detail plan view of the second alternative embodiment.
Figure 10:
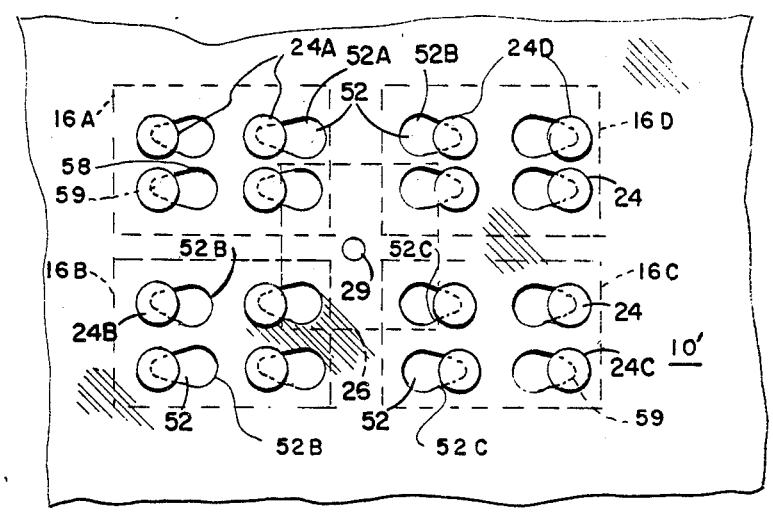
FIG. 10 is a bottom detailed plan view of the assembly shown in FIG. 10.

A preferred alternative embodiment of the invention is shown in FIGS. 8-10 which provides for greater ease of installation of the transformers to the base plate and also provides for a greater tolerance of fit of the undercut annular sections 22 of the transformer legs 24 into the respective reduced size sections of the respective mounting holes.

The base plate 10' is formed with four sets each 52A, 52B, 52C, 52D of four shaped mounting holes 52, with each hole 52 of each set of mounting holes located to accommodate one of the four legs 24 of a transformer 16A, 16B, 16C, 16D respectively. The holes 52 are each formed as a tear drop shape being each formed of a relatively enlarged-size rounded hole section 58 that is joined to a relatively reduced-size rounded hole section 59 by tangential edge walls 54.

The enlarged-size hole opening section 58 of each mounting hole 52 is of a size to freely accomodate the full size section of a transformer leg 24. The reduced-size section 59 of each mounting hole 52 is of a smaller size than that of the maximum size section of a transformer leg 24, but is of a size to freely accomodate the circular undercut section 22 of a transformer leg. The reduced-size hole section 59 of each of the shaped mounting holes 52 projects along the longitudinal axis V—V of the hole 52, in a direction away from the common plate mid-axis Y—Y, with the longitudinal axis V—V of each hole being parallel to the lateral axis X—X of the plate 10'. Each pair of two sets of mounting holes 52 are located on opposed sides of the common longitudinal mid-axis Y—Y of the plate. It is to be noted that the mid-axis V—V of each hole 52 is generally perpendicular to longitudinal mid-axis Y—Y of the plate 10'.

A portion of the reduced size hole section 59 of each hole 52 is preferably bounded by a first circular arc section 59'. Arc section 59' is joined to a second circular arc section 58' that bounds a portion of hole section 58 by straight line sections 54 that are each tangent to both said arc sections so as to prevent abrupt changes in the width of the hole 52 along the longitudinal axis V—V of the hole 52.

The embodiment of the base plate 10', illustrated in FIGS. 8-10 is preferred for use when assembling transformers and other components to the base plate under production conditions where some misalignment of the location of the four legs relative to the spacing of the holes in the base plate may be anticipated during the assembly operation.

Figure 12:
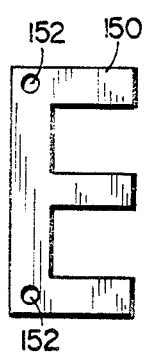
FIG. 12 is a plan view of a transformer lamination.
Figure 13:
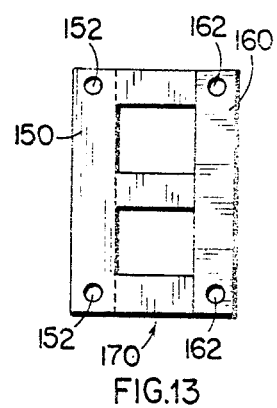
FIG. 13 is a plan view of a plurality of transformer laminations assembled together to form the transformer frame.

A teardrop shape is preferred for the outline of the mounting holes in the base plate because such a shape allows for increased tolerances in the spacing of the transformer legs from each other. The legs of transformers are spaced apart from each other by the internal spacing of holes in the plurality of iron lamination plates which make up the structural frame of the transformer. As shown in FIGS. 12-13, such lamination plates 150, 160 are each typically formed in the shape of an "E", with each E-shape plate formed with two mounting holes 152, 162 respectively for holding of transformer legs, and with the said E-shaped plates meshed together about transformer coils to form a rectangular "figure 8" shaped frame 170 formed with four holes into each of which is fixed a transformer leg that projects beyond the frame for mounting into a base plate. The consequence of this type of assembly of the transformer laminations results in somewhat non-uniform irregular spacing from each other of the mounted transformer legs, thus requiring a substantial tolerance in the spacing and size of conventional mounting holes in the base plate which receive the transformer legs.

As shown in FIGS. 8-10, the tangential line sections forming the side walls 54 of each mounting hole 52 provide for a gradual transition of the width, perpendicular to the lateral axis, of the opposed walls of each mounting hole as each of four engaged transformer legs are slid laterally within the mounting holes to the latched position.

To mount a transformer to a base plate 10' an assembler initially locates each of the four transformer legs 24 within the confines of a respective large size hole section 58 and moves the transformer to or from the base plate 10' so as to locate the slot section 22 of each leg 24 within the plane of the base plate. The tangential side wall sections 54 of each mounting hole serve as guides to direct each respective leg 24 into position within the confines of the reduced size hole section 59 as the legs 24 of a transformer unit 24 are manually slid parallel to lateral axis X—X of the plate in the direction away from the common mid-axis Y—Y of plate 10' and along the longitudinal axis Z—Z of holes 52.

The gradual change of cross-section of each teardrop shaped hole 54 prevents any transformer leg section 24 from becoming snagged during the assembly operation. By contrast, when mounting the transformer legs into base plate holes 12 of plate 10 that are shaped with abrupt changes of width such as those of a keyhole-shape hole 12, snagging of one or more transformer legs may be encountered in the assembly operation, usually when the undercut section 22 of one or more transformer legs have entered the reduced size section 19 portion of each hole 12, and before all of the other undercut section of the legs have simultaneously become engaged in the reduced size portion of their respective holes. Misalignment of the slot sections 22 of the legs 24 with respect to the spacing of the entry to the reduced size hole sections 19 of a keyhole-shape hole 12, during the assembly operation, is difficult to prevent since the transformer legs 24 partially obscure the base hole 12 from view of the assembler.

This snagging engagement of the transformer legs 24 within a keyhole-shaped hole 12, formed with a large hole section abruptly joined to a small hole section, serves to delay the manual assembly operation of mounting a transformer to a base plate. The operator frequently must restart the assembly operation by withdrawal of those transformer legs that were successfully engaged in the respective reduced hole sections and repeat the assembly operation again in an attempt to simultaneously realign the undercut section 22 of all legs 24 with respect to the reduced size hole sections 19 so as to attempt to orient each transformer leg, located in the enlarged portion of a mounting hole, to the location of the respective reduced hole section, prior to laterally sliding all the transformer legs as a unit laterally out of the respective enlarged hole sections and into the reduced sections of the respective mounting hole.

In the preferred embodiment of the invention described in FIGS. 8–10, such snagging effects are not encountered, providing for a greater tolerance in the spacing of the transformer legs relative to teach other. After each of the four legs of a transformer has been individually inserted into the enlarged section 58 of a respective mounting hole 52, and after the undercut portion 22 of each transformer leg 24 is manually aligned to lie within the plane of the base plate 10' and within the bounds of the respective mounting hole 52 in the base plate, the transformer and legs may be then be readily slid in a direction parallel to the plane of the base plate and away from the mid-axis Y—Y of the base plate into the latched position, because there is a gradual rather than an abrupt change of hole section width along the longitudinal axis V—V of the hole 52 from the wide section 58 of the hole 52 to the narrow section 59 of mounting hole 52 and because the side edge walls 54 of mounting holes 52 are substantially tangential to the arc sections 58', 59' that bound the opposed longitudinal edges of the mounting hole 52.

In the latched position, the walls of the arc section 59' of the reduced-size section 59 of each mounting hole and/or the tangential edge walls 54 of the hole 54 fit about opposed external surfaces of the annular slot section 22 of the leg 24 of an engaged transformer leg to prevent any motion of the engaged leg along an axis perpendicular to the plane of the base plate 10', as well as to prevent movement parallel to the mid-axis Y—Y of the base plate 10' and to prevent further movement of the engaged leg along the longitudinal axis V—V of the base plate hole in the direction away from the common mid-axis Y—Y of the base plate 10'.

Motion of the transformers, in the unlatching direction, along the lateral axis towards the common mid-axis Y—Y of the base plate may then be prevented by installation of a spacer latch plate 26.

The latch plate 26 may be fastened to the base plate by a screw 28 or by other means. The latch plate is mounted over the the common mid-axis axis of the base plate and is of a shape and size to abut against at least one leg each of each pair of transformers that are mounted on opposed sides of the common mid-axis Y—Y of the base plate. The installed latch plate prevents any of the transformers from sliding from the latched position towards the mid-axis of the base plate and consequently prevents all transformer legs from sliding away from engagement in the reduced sections of the respective base plate mounting holes or from moving in any direction with respect to the base plate.

Figure 11:
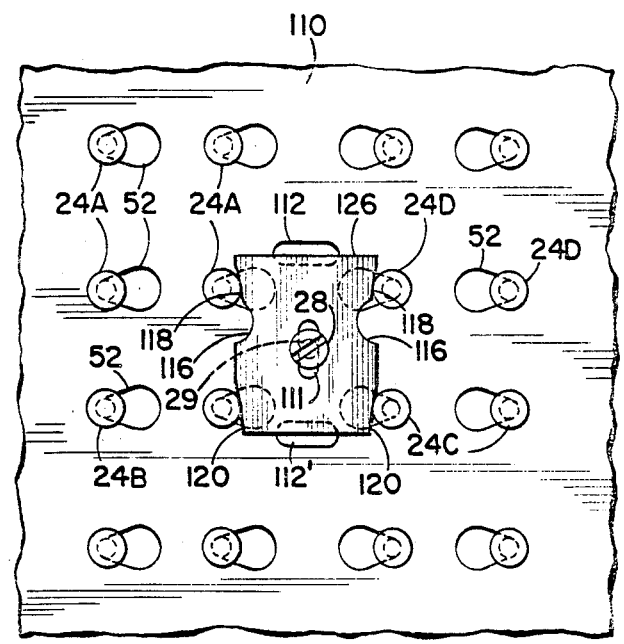
FIG. 11 is a third alternative embodiment of the invention shown in bottom detailed plan view.

FIG. 11 shows an improved latch plate embodiment shown from underneath base plate 110. FIG. 11 illustrates the latch plate 126 as being mounted to the underside of base plate 110 for ease of exposition. In practice, the latch plate may be mounted on the face side of the base plate from which the transformer projects.

As shown, latch plate 126 is in the general shape of a vase, with a pair of opposed semi-circular cut-outs 116 bounding a diminished area C separating the cut-outs. Diminished area C lies between separate latch plate segments A and B. In use, each of the two opposed diagonal sidewalls 118 of segment A bear against a transformer leg 24A, 24B of a pair of transformers 16A, 16B in the fully latched position of the latch plate 126, and each of the two opposed diagonal sidewalls 120 of segment B bear against a transformer leg 24C, 24D of a pair of transformers 16C, 16D in the fully latched position of the latch plate 126. Alternatively the mounting holes in the base plate may be spaced relative to each other to enable the latch plate to bear against two legs of a common transformer on each side of the latch plate, when only two separate transformers are mounted to the base plate.

As shown in FIG. 11 the latch plate is a length so as to terminate short of the mounting holes 52 in which transformer legs 24B and 24C may be mounted when the latch plate is in the fully unlatched position and the cut-out sections 116 located in line with a pair of mounting holes in which transformer legs 24A and 24D are to be fitted. This permits the transformer legs of all of four transformers to be freely moved into the enlarged sections of each mounting hole for removal and replacement in the fully unlatched position of the latch plate. Alternatively, the latch plate 126 may be of longer length and provided with a second set of cut-out sections (not shown) located in line with the mounting holes in which each of a transformer leg 24C, 24D is to be latched in place in the fully latched position of the latch plate.

Spaced-apart through slots 112 and 112' are each formed in the base plate 110 and are each of a size to admit a screw driver blade (not shown) and to permit rotation of a said screw driver blade in a said slot 112, 112'. Slot 112 is located in base plate 110 so that a screw driver blade inserted into slot 112 will bear against a first end wall of latch plate 126, when latch plate 126 is initially installed, with slot 112 being of a size and shape to permit manual rotation of the said screwdriver blade within said slot, causing the screwdriver blade to bear against the said latch plate end wall and force the said latch plate to slide along the latch plate.

Slot 112' is located in base plate 110 so that a screw driver blade inserted into slot 112' will bear against a second end wall of latch plate 126, when latch plate 126 is installed in the latched position, with slot 112' being of a size and shape to permit manual rotation of the said screwdriver blade within said slot 112' and causing the said screwdriver blade to bear against the said second latch plate end wall so as to force the said latch plate to slide along the mid-axis of base plate 110 in the latching direction of the latch plate towards an unlatched position in which the latch plate does not bear against the mounted transformer legs.

The two cut-out sections 116 of the latch plate 126 are of a size and shape to each receive a transformer leg 24A, 24B that has been slid in the direction of the mid-axis Y—Y of the base plate to the enlarged portion 58 of a mounting hole 52 respectively when the latch plate is located in the completely unlatched position with respect to the base plate and transformer legs. In this completely unlatched position, the legs 24 which fit into said cut-out sections are free to be removed from engagement with base plate mounting holes, or conversely to be installed into said mounting holes.

The side wall sections 118 and 120 of latch plate 126 are each tapered to each lie along a line diagonal to said end walls and diagonal to the installed base plate mid-axis Y—Y, with said side walls located to each bear against a leg 24A, 24B, 24C, or 24D of a mounted transformer so that said side walls 118 and 120 exert a wedge action against one abutting transformer legs of each of four individual transformers 16A, 16B, 16C, 16D respectively, when the latch plate is slid along plate mid-axis Y—Y from the completely unlatched position to the completely latched position, consequently forcing each abutting transformer leg away from the mid-axis Y—Y of plate 110, and into the reduced size hole section 19 or 59 of the respective mounting hole 12 or 52 to positively latch the transformer legs against movement or vibration relative to the base plate.

A through slot 111 is formed in latch plate 126 of a size and shape to fit about a screw 28 threaded into mounting hole 29 of the base plate. Slot 111 is of a length to permit free travel of the latch plate 126 relative to base plate 110 from the completely unlatched position to the completely latched position of the latch plate 126, when the screw is engaged in mounting hole 29 in the untightened condition. 126 in fixed position to the base plate in any position of the latch plate including the completely latched position and the completely unlatched position.

The device of the invention has been thoroughly tested under actual use conditions and has been found to be completely successful for the accomplishment of the above stated objects of the present invention.

It will thus be seen that there is provided a device in which the several objects of the invention are achieved, and which is well adapted to meet the conditions of practical use.

It is thought that persons skilled in the art to which this invention relates will be able to obtain a clear understanding of the invention after considering the foregoing description in connection with the accompanying drawing. Therefore, a more lengthy description is deemed unnecessary. It is to understood that various changes in shape, size, and arrangement of the elements of this invention as claimed may be resorted to in actual practice, if desired.

Having thus described the invention, what I claim as new and desire to secure by Letters Patent of the United States is:

1. An improved slide lock mounting plate assembly that provides secure attachment of at least two spaced components each having at least one appendage to a base plate, and which also provides for ready detachment of said components as desired, comprising:
   a base plate onto which said components may be detachably mounted, said plate formed with at least one shaped mounting hole for each component;
   each said mounting hole formed of a larger first hole section from which an appendage engaged in said base plate may be freely removed, and a relatively smaller size second hole section joined to the first hole section into which a shaped appendage of a component may be engaged in said mounting hole in a captive relation to said base plate;
   a latch means attachable to said base plate, said latch means of a size and shape to retain a said appendage that has been engaged into a said mounting hole, in fixed nondetachable engagement to said base plate, when said latch means is attached to said base plate; wherein
   the said second hole section of each of the mounting holes that are located to engage the appendages of a first individual component, is each shaped to extend from the first hole section of each said mounting hole in a direction away from the location of a second spaced component, and
   said latch means is a detachable spacer means of a size and shape to restrain movement of said first individual component towards said second individual component when appendages of said first and second individual components are engaged in said second hole sections and said spacer means is attached to said base plate.

2. The invention as recited in claim 1, together with a component formed with a body section fitted to at least one leg member, said leg member shaped to project away from said body section, said leg member terminating in a free end section having an undercut section and a cross-sectional shape of a size to freely fit through the larger said first hole section; said free end section being too large in cross-section to pass through said smaller second hole section;
   said free end section of the leg member adjoining said undercut section of the leg member,
   said undercut section of the leg member being of a size and shape to freely pass through said smaller second hole section;
   said leg member and said component body being of a size and shape to restrict movement of the component in a direction other than movement parallel to the plane of the base plate when the said undercut section of the leg member is engaged in the said second hole section of the base plate.

3. The invention as recited in claim 1 in which some of said mounting holes are spaced so as to each accommodate the attachment of an individual leg member of a component fitted with a plurality of leg members.

4. The invention as recited in claim 1 wherein said base plate has teardrop shaped holes for receiving said legs.

5. The invention as recited in claim 1 wherein said base plate has keyhole shaped holes for receiving said legs.

6. The invention as recited in claim 1 in which said spacer means is in the form of a latch plate mounted on the base plate between the first and second individual components.

7. The invention as recited in claim 6, together with fastener means to detachably fasten the latch plate to said base plate.

8. The invention as recited in claim 6, in which one or more resilient finger elements extend from said latch plate, with each said finger elements shaped to bear against a leg member of component engaged to the base plate so as to apply a bias against the said leg member to restrain it in the latched position of the component to the base plate.

9. The invention as recited in claim 7 in which the base plate is formed with individual mounting holes of a shape and located to engage a component with four leg members.

10. The invention as recited in claim 7 in which the base plate is formed with individual mounting holes of a shape and located to engage four components, each fitted with four leg members.

11. The invention as recited in claim 8 in which the component is an electrical device.

12. The invention as recited in claim 11 in which the component is a transformer.

13. The invention as recited in claim 3 wherein a plurality of shaped mounting holes for a plurality of leg members of a single component are arranged with second hole sections that extend away along parallel axes from respective first hole sections.

14. An improved slide lock mounting plate assembly that provides secure attachment of an appendage of a component to a base plate, and which also provides for ready detachment of the appendage as desired, comprising:

a base plate onto which at least one separate of said components may be detachably mounted, said plate formed with at least one mounting hole;

each said mounting hole formed of a larger first hole section from which an appendage engaged in said base plate may be freely removed, and a relatively smaller size second hole section joined to the first hole section into which a shaped appendage of a component may be engaged in said mounting hole in a captive relation to said base plate;

a latch plate attachable to said base plate, said latch plate of a size and shape to retain a said appendage that has been engaged into a said mounting hole, in fixed nondetachable engagement to said base plate, when said latch plate is attached to said base plate, said latch plate including a pair of opposed end sections each bounded by tapered side walls, said end sections being separated by a diminished section, and of a size and shape that said tapered side walls are arranged to abut, in the mounted position of a pair of said components to a said base plate, at least one appendage of each said component, in the latched position of the latch plate;

said latch plate being moveable to an unlatched position so as to be adaptable to receiving in the diminished section thereof, a portion of each said appendage of the two separately spaced mounted components, thereby permitting both said components to be moved towards each other while engaged in the base plate mounting holes from a first latched position of the components in the mounting holes into a second unlatched position in which the appendage of each spaced component may be freely removed from engagement with the said base plate without interference with said latch plate.

15. The invention as recited in claim 14 in which a through slot is formed in the base plate of a size and shape to receive a tool, said slot located so as to enable a said tool located in said slot to bear against the said latch plate so as to apply bearing force against the latch plate in the direction of moving the latch plate into the completely latched position.

16. The invention as recited in claim 14 in which a through slot is formed in the base plate of a size and shape to receive a tool, said slot located so as to enable a said tool located in said slot to bear against the said latch plate so as to apply bearing force against the latch plate in the direction of moving the latch plate away from the completely latched position.

17. The invention as recited in claim 16 in which a through slot is formed in said latch plate of a size and shape to receive a screw that is threaded into the base plate, said size and shape of said slot permitting the latch plate to move from a completely unlatched position to a completely latched position when the screw is in an untightened mode, said screw serving to fix the latch plate in relation to the base plate in the fully tightened mode of said screw to said base plate.

* * * * *